(12) United States Patent
Liu et al.

(10) Patent No.: US 11,782,185 B1
(45) Date of Patent: Oct. 10, 2023

(54) BALLASTLESS TRACK ROADBED DAMAGE FOREWARNING METHOD AND SYSTEM CONSIDERING UNCERTAINTY

(71) Applicant: Southwest Jiaotong University, Chengdu (CN)

(72) Inventors: Kaiwen Liu, Chengdu (CN); Ruizhe Qiu, Zhengzhou (CN); Qian Su, Chengdu (CN); Jun Gao, Wuhan (CN); Pengpeng Ni, Zhuhai (CN); Yanfei Pei, Tianshui (CN)

(73) Assignee: SOUTHWEST JIAOTONG UNIVERSITY, Chengdu (CN)

( * ) Notice: Subject to any disclaimer, the term of this patent is extended or adjusted under 35 U.S.C. 154(b) by 0 days.

(21) Appl. No.: 18/297,455

(22) Filed: Apr. 7, 2023

(30) Foreign Application Priority Data

Apr. 8, 2022 (CN) .......................... 202210366148.1

(51) Int. Cl.
*G01V 99/00* (2009.01)
*G06F 30/25* (2020.01)
*B61L 23/04* (2006.01)
*E01B 1/00* (2006.01)

(52) U.S. Cl.
CPC ............ *G01V 99/005* (2013.01); *B61L 23/04* (2013.01); *G06F 30/25* (2020.01); *E01B 1/002* (2013.01)

(58) Field of Classification Search
None
See application file for complete search history.

(56) References Cited

FOREIGN PATENT DOCUMENTS

| CN | 105507085 B | * | 5/2017 | |
|---|---|---|---|---|
| CN | 110728000 B | * | 6/2021 | .......... G01M 5/0066 |
| CN | 114228786 A | * | 3/2022 | |

OTHER PUBLICATIONS

Lam, Heung-Fai, Mujib Olamide Adeagbo, and Yeong-Bin Yang. "Time-domain Markov chain Monte Carlo—based Bayesian damage detection of ballasted tracks using nonlinear ballast stiffness model." Structural Health Monitoring 20.5 (2021): 2653-2677 (Year: 2021).*

CN105507085b, translation (Year: 2017).*

(Continued)

*Primary Examiner* — Lina Cordero
(74) *Attorney, Agent, or Firm* — Zhigang Ma

(57) ABSTRACT

A ballastless track roadbed damage forewarning method considering uncertainty includes the following steps. Step 1: counting roadbed material parameters and precipitation; Step 2: establishing a FLAC-PFC model of a ballastless track roadbed and calibrating mesoscopic parameters of a roadbed surface layer; Step 3: generating a lognormal random field of particle contact friction coefficients and assigning it to particle contact nodes of the roadbed surface layer; Step 4: perform sampling on the precipitation and adjusting a fluid domain of the roadbed surface layer; Step 5: determining a worst spatial correlation distance in the random field; and Step 6: calculating a damage probability pf of the roadbed surface layer under the worst spatial correlation distance; outputting alarm information when pf exceeds an alarm threshold, otherwise, quitting. The method monitors and gives early warning of damage to the roadbed surface layer under dynamic loads, ensuring driving safety.

7 Claims, 2 Drawing Sheets

(56) References Cited

OTHER PUBLICATIONS

CN114228786a, translation (Year: 2022).*
He, Li Jing Wen, and Quan Mei Gong. "PFC's Application on the Dynamic Response Analysis of High Speed Railway Ballastless Subgrade." Applied Mechanics and Materials, vol. 505-506, Trans Tech Publications, Ltd., Jan. 2014, pp. 9-14. Crossref, doi: 10.4028/www.scientific.net/amm.505-506.9 (Year: 2014).*
CN110728000B translation (Year: 2021).*
CNIPA, Notification of a First Office Action for CN202210366148.1, dated May 25, 2022.
Southwest Jiaotong University (Applicant), Reply to Notification of a First Office Action for CN202210366148.1, w/ (allowed) replacement claims, dated Jun. 7, 2022.
CNIPA, Notification to grant patent right for invention in CN202210366148.1, dated Jun. 10, 2022.

* cited by examiner

BALLASTLESS TRACK ROADBED DAMAGE FOREWARNING METHOD AND SYSTEM CONSIDERING UNCERTAINTY

TECHNICAL FIELD

The disclosure relates to the filed of railway engineering service safe, in particularly to a ballastless track roadbed damage forewarning method and system considering uncertainty.

BACKGROUND

Chinese high-speed railway already turned from large-scale construction to conserve operation stage. Under the action of traffic cycle load and long-term rainfall, and the durability of sealing layer materials having a certain time limit, it is inevitable that the rain penetrates into the roadbed through the failure of the sealing layer and expansion joint, thus inducing the damage of ballastless track roadbed. The surface layer damage of the roadbed will cause the void between the roadbed and the track structure, and the structure dynamic response will increase significantly and then affect the safety of train operation and passenger comfort, which has become an urgent problem to be solved in the safety field of railway engineering roadbed service.

Due to the uncertainty of environmental precipitation, the uncertainty of filler parameters and the error brought by construction, the accuracy of traditional deterministic analysis method is low, and it is difficult to achieve the advanced monitoring and early warning of roadbed damage of ballastless track, which may lead to miss the best opportunity for roadbed maintenance and cause serious economic losses. Therefore, it is urgent to develop a method and system for damage forewarning of the ballastless track roadbed considering uncertainty.

SUMMARY

In order to solve the technical problem of the disclosure and overcome the deficiency of the prior art, the disclosure provides a ballastless track roadbed damage forewarning method and system considering uncertainty.

The technical solutions of the disclosure are as follows:

A ballastless track roadbed damage forewarning method considering uncertainty includes the following steps:

step 1: obtaining roadbed material parameters and precipitation over a period of time;

step 2: establishing a fast Lagrangian analysis of continuum (FLAC)-particle flow code (PFC) model of the ballastless track roadbed, calibrating particle materials of a roadbed surface layer according to the roadbed material parameters obtained in step 1 and obtaining mesoscopic parameters of the particle materials;

step 3: generating a lognormal random field of particle contact friction coefficients, and assigning the lognormal random field to particle contact nodes of the roadbed surface layer in the FLAC-PFC model obtained in step 2;

step 4: performing Monte Carlo sampling based on a probability density function of the precipitation over the period of time obtained in step 1, and adjusting a fluid domain of the roadbed surface layer according to the samples (i.e., precipitation);

step 5, increasing a spatial correlation distance θ in a step by step manner, calculating a structure dynamic response, and determining a worst spatial correlation distance $\theta_{worst}$; and step 6, calculating a damage probability pf of the roadbed surface layer under the worst spatial correlation distance $\theta_{worst}$ obtained in step 5; and outputting alarm information when the damage probability pf exceeds an alarm threshold p, otherwise, quitting.

In an embodiment, the roadbed material parameters in step 1 are obtained according to a field test, and include: base plate parameters, and material parameters of the roadbed surface layer and a roadbed bottom layer; and the base plate parameters include: a density and modulus of elasticity; and the material parameters of the roadbed surface layer and the roadbed bottom layer include: a density, a gradation, modulus of elasticity, a cohesion and a friction angle.

In an embodiment, in step 2, particle contacts of the roadbed surface layer adopt a Hertz contact model, and the mesoscopic parameters include: shear modulus, a Poisson's ratio and a friction coefficient; FLAC is a kind of continuous medium mechanics analysis software, which is used to establish a finite difference model of the base plate and a roadbed bottom layer; PFC is a particle flow program built in FLAC, which is used to establish a discrete element model of the roadbed surface layer; and the FLAC-PFC model is to call PFC program through a built-in interface of FLAC, so as to perform a coupling analysis between the finite difference model of the base plate and the roadbed bottom layer established by FLAC and the discrete element model of the roadbed surface layer established by PFC.

In an embodiment, the generating a lognormal random field of particle contact friction coefficients in step 3, includes:

extracting spatial positions of the particle contact nodes and the particle contact friction coefficients in the discrete element model of the roadbed surface layer, and importing the spatial positions and the particle contact friction coefficients into a MATLAB script; and setting the spatial correlation distance θ of the particle contacts of the roadbed surface layer in the MATLAB script, calculating a correlation coefficient ρ between friction coefficients at any two coordinate points by using a Markov spatial correlation function, and generating the lognormal random field of the particle contact friction coefficients.

In an embodiment, a formula of the Markov spatial correlation function in the MATLAB script is as follows:

$$\rho(\tau_x, \tau_y) = \exp\left(-\frac{2\sqrt{\tau_x^2 + \tau_y^2}}{\theta}\right)$$

where ρ represents the correlation coefficient between the two coordinate points of the roadbed surface layer, $\tau_x$ and $\tau_y$ respectively correspond to absolute distances between the two coordinate points in horizontal and vertical directions, and θ represents a spatial correlation length.

In an embodiment, obtaining the worst spatial correlation distance $\theta_{worst}$ in step 5, includes:

increasing the spatial correlation distance θ in the step by step manner, generating N random fields of the particle contact friction coefficients of the roadbed surface layer (i.e., repeatedly performing the random field generation on the particle contact friction coefficients of the roadbed surface layer for N times) and performing N sampling on the precipitation under a i-th spatial correlation distance $\theta_i$, applying a high-speed train load and bringing the high-speed train load into model calculation to obtain N groups of dynamic response results of the base plate, and taking an average value of the N groups of dynamic response results as a representative value of the dynamic response of the base plate under $\theta_i$; and comparing the representative values of the dynamic response of the base plate under different $\theta_i$, taking a spatial correlation distance corresponding to the representative value of the maximum dynamic response as the worst spatial correlation distance $\theta_{worst}$.

In an embodiment, obtaining the damage probability pf of the roadbed surface layer in step 6, includes:

generating M random fields of the particle contact friction coefficients of the roadbed surface layer and performing M sampling on the precipitation under the worst spatial correlation distance $\theta_{worst}$ to obtain M groups of samples, and applying the high-speed train load to calculate a dynamic response of the base plate in each of the M groups of samples; and when any dynamic response of the base plate exceeds a specified safety threshold, determining that the roadbed surface layer is damaged and endangers a superstructure, and counting the number of damaged samples i, and calculating the damage probability using a formula: pf=i/M.

A forewarning system by using the above ballastless track roadbed damage forewarning method considering uncertainty, includes: an information collection module, a processing module, and a forewarning module;

the information collection module is configured to collect material parameters of the ballastless track roadbed and real-time precipitation information;

the processing module is configured to load the FLAC-PFC model and calibrate the mesoscopic parameters based on the information collected by the information collection module; load the MATLAB script, generate a random field, and assign the random field to the particle contact nodes; calculate the worst spatial correlation distance $\theta_{worst}$ and calculate the damage probability pf, and the forewarning module is configured to determine whether the damage probability exceeds the alarm threshold; if damage probability exceeds the alarm threshold, output the alarm information; if the damage probability does not exceed the alarm threshold, exit.

In an embodiment, each of the information collection module, the processing module and the forewarning module is embodied by at least one processor and at least one memory coupled to the at least one processor, and the at least one memory stores programs executable by the at least one processor.

Compared with the prior art, the beneficial effects of the disclosure are as follows.

According to the scheme provided by the embodiment of the disclosure, the randomness of the precipitation in the roadbed area and the uncertainty of the roadbed surface layer material parameters changing with space are considered, and the damage probability of the roadbed surface layer under the action of rain and dynamic load is quantitatively predicted by combining a FLAC-PFC coupling numerical analysis method. The disclosure provides a powerful means for damage monitoring of the ballastless track roadbed, and the analysis method has clear flow and strong reliability.

DETAILED DESCRIPTION OF THE EMBODIMENTS

The content not described in detail in the specification of the disclosure belongs to the publicly known technique of those skilled in the art.

The following will provide a clear and complete description of the technical solution in embodiments of the disclosure in conjunction with the accompanying drawings. Apparently, the described embodiments are some of the embodiments of the disclosure, not all of them. Based on the embodiments in the disclosure, all other embodiments obtained by those skilled in the art without creative work fall within the scope of protection of the disclosure.

Figure 1:
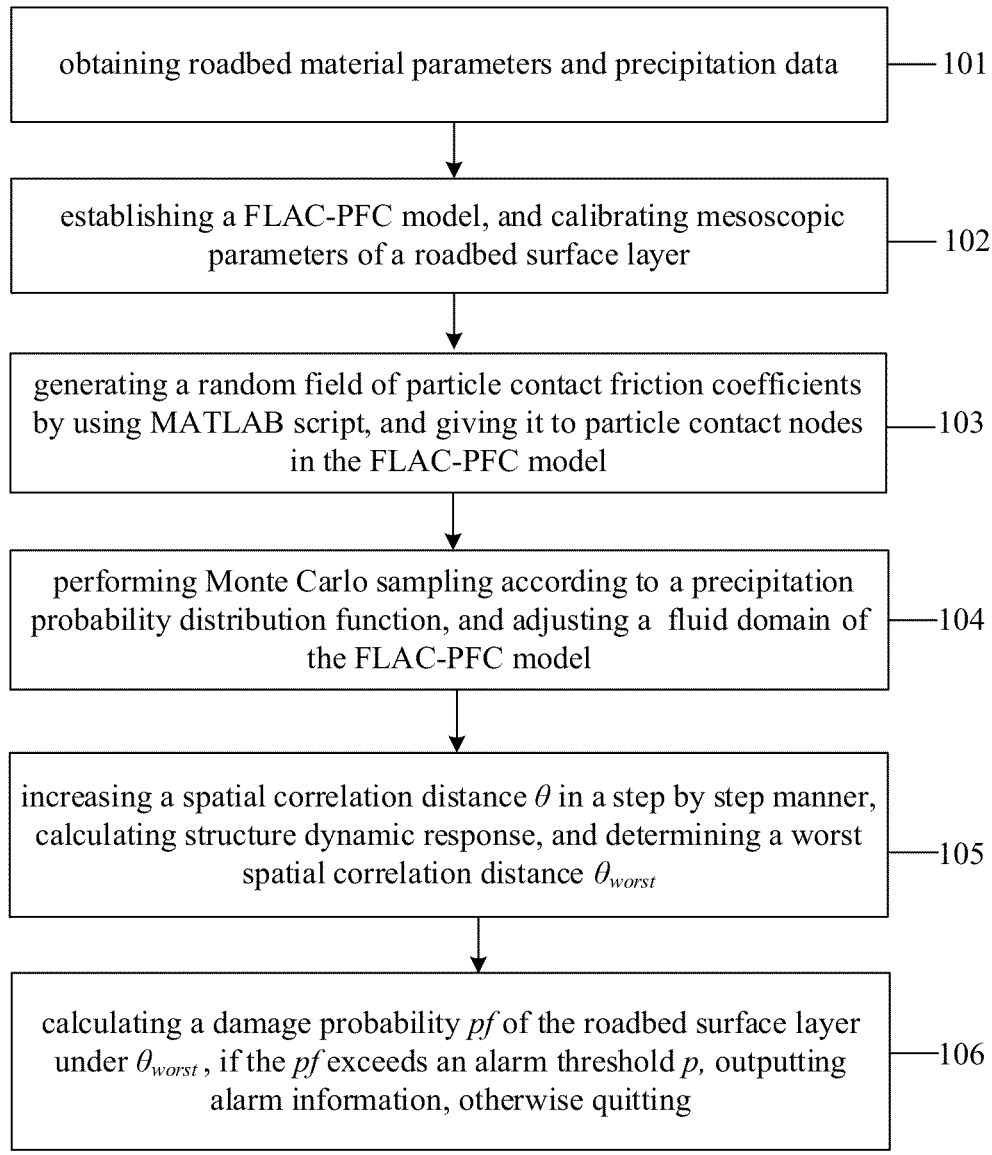
FIG. 1 illustrates a flowchart of a forewarning method according to an embodiment of the disclosure.

Referring to FIG. 1, a ballastless track roadbed damage forewarning method considering uncertainty provided by an embodiment of the disclosure is illustrated, including the following steps.

Step 101: obtaining precipitation in a monitoring area for a period of time, and calculating a probability density function of the precipitation using a maximum entropy principle; obtaining material parameters of a base plate 1, a roadbed surface layer 2, and a roadbed bottom layer 3 of the ballastless track.

Step 102: establishing a finite difference model of the base plate 1 and the roadbed bottom layer 3 through fast Lagrangian analysis of continuum (FLAC), assigning values based on the material parameters obtained in step 101, establishing a discrete element model of the roadbed surface layer 2 through particle flow code (PFC), and calibrating mesoscopic parameters of particle materials of the roadbed surface layer 2 based on the material parameters obtained in step 101.

Step 103: extracting spatial positions of particle contact nodes and friction coefficients of particle contacts of the discrete element model of the roadbed surface layer 2, and importing them into a MATLAB script; setting a spatial correlation length $\theta$ of the friction coefficients of the particle contacts of the roadbed surface layer 2 in the MATLAB script, calculating a correlation coefficient $\rho$ between the friction coefficients at any two coordinate points by using a Markov spatial correlation function, generating a lognormal random field of the friction coefficients of the particle contacts and giving it to the corresponding particle contact nodes in the FLAC-PFC model, and the Markov spatial correlation function is as follows:

$$\rho(\tau_x, \tau_y) = \exp\left(-\frac{2\sqrt{\tau_x^2 + \tau_y^2}}{\theta}\right)$$

where $\rho$ represents the correlation coefficient between two coordinate points on the roadbed surface layer, $\tau_x$ and $\tau_y$ respectively correspond to absolute distances between two points in horizontal and vertical directions, and $\theta$ represents the spatial correlation length.

Step 104: performing Monte Carlo sampling on the precipitation according to its probability density function, and adjusting a corresponding fluid domain of the roadbed surface layer according to the samples (i.e., precipitation).

Step 105: applying a high-speed train load, and calculating a dynamic response of the base plate; repeating step 103, and increasing θ in a step by step manner. Under each $θ_i$, the random field generation of the friction coefficients of the particle contacts of the roadbed surface layer is repeated for N times, and the precipitation is sampled for N times. The high-speed train load is applied and brought into the model calculation, and an average value of N groups of dynamic response of the base plate is taken as a representative value of the dynamic response of the base plate under $θ_i$. By comparing the representative values of the dynamic response of the base plate under different $θ_i$, a worst spatial correlation distance $θ_{worst}$ is determined. Where i is a positive integer.

Step 106: under $θ_{worst}$, the random field generation of the friction coefficients of the particle contacts of the roadbed surface layer is repeated for M times, and the precipitation is sampled for M times to obtain M groups of samples, and the dynamic response results of the base plate in each group of samples are calculated by applying the high-speed train load; a safety threshold of the dynamic response according to the standard and a damage alarm threshold p of the roadbed surface layer according to the operation conditions are input. The dynamic response of the base plate includes the maximum vibration amplitude, maximum vibration acceleration, maximum dynamic stress and maximum dynamic strain of the base plate. When any dynamic response of the base plate exceeds the specified macro-safety threshold, it is determined that roadbed surface layer is damaged and endangers the superstructure. The damage probability pf of the roadbed surface layer is calculated, when pf exceeds the alarm threshold p, the alarm information is sent to the monitoring personnel, otherwise quitting. The calculation method of the damage probability pf includes: counting the number of damaged samples i in the M groups of samples, pf=i/M.

Figure 2:
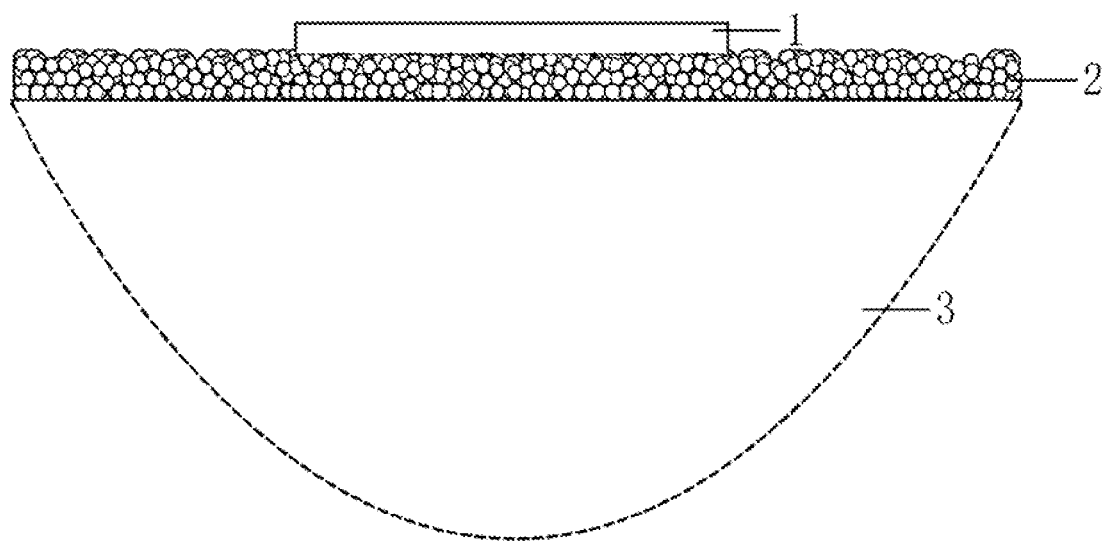
FIG. 2 illustrates a schematic diagram of a FLAC-PFC coupling model of a roadbed of a high-speed rail ballastless track according to an embodiment of the disclosure; in which, 1: base plate, 2: roadbed surface layer, 3: roadbed bottom layer.

Referring to FIG. 2, the FLAC-PFC coupling numerical model is established, which includes the base plate 1 of the ballastless track based on an elastic material model, with the parameters including density and modulus of elasticity; the roadbed bottom layer 3 based on a Mohr-Coulomb model, with parameters including density, modulus of elasticity, cohesion, and friction angle; and the roadbed surface layer 2 based on a Hertz contact model, with the parameters including gradation, shear modulus, Poisson's ratio, and friction coefficient.

The scheme provided by the embodiment of the disclosure takes into account the randomness of precipitation in the subgrade area and the spatial uncertainty of the material parameters of the surface layer of the roadbed, and combines the FLAC-PFC coupling numerical analysis method to predict the damage of the track roadbed under dynamic loads and rain, which helps to ensure the safety of high-speed railway traffic.

It should be noted that in this article, the terms "include", "contain", or any other variation thereof are intended to cover non-exclusive inclusion, so that a process, method, article, or device that includes a series of elements includes not only those elements, but also other elements that are not explicitly listed, or also elements inherent in such the process, method, article, or device. Without further restrictions, the element defined by the statement "includes a . . . " does not preclude the existence of another identical element in the process, method, article, or device that includes the element.

The embodiments of the disclosure have been described above with reference to the accompanying drawings, but the disclosure is not limited to the specific embodiments described above, which are merely illustrative and not restrictive. With the inspiration of the disclosure, those skilled in the art can also make many forms that fall within the protection of the disclosure, without departing from the scope protected by the purpose and claims of the disclosure.

What is claimed is:

1. A ballastless track roadbed damage forewarning method, comprising the following steps:
    step 1: obtaining roadbed material parameters and precipitation over a period of time;
    step 2: establishing a fast Lagrangian analysis of continuum (FLAC)-particle flow code (PFC) model of a ballastless track roadbed, calibrating particle materials of a roadbed surface layer according to the roadbed material parameters obtained in step 1, and obtaining mesoscopic parameters of the particle materials; wherein FLAC is a kind of continuous medium mechanics analysis software, which is used to establish a finite difference model of a base plate and a roadbed bottom layer; PFC is a particle flow program built in FLAC, which is used to establish a discrete element model of the roadbed surface layer; and the FLAC-PFC model is to call PFC program through a built-in interface of FLAC, so as to perform a coupling analysis between the finite difference model of the base plate and the roadbed bottom layer established by FLAC and the discrete element model of the roadbed surface layer established by PFC;
    step 3: generating a lognormal random field of particle contact friction coefficients, and assigning the lognormal random field to particle contact nodes of the roadbed surface layer in the FLAC-PFC model obtained in step 2;
    step 4: performing Monte Carlo sampling based on a probability density function of the precipitation over the period of time obtained in step 1, and adjusting a fluid domain of the roadbed surface layer according to the precipitation;
    step 5: increasing a spatial correlation distance θ in a step by step manner, calculating a dynamic response of the base plate, and determining a worst spatial correlation distance $θ_{worst}$; and
    step 6: calculating a damage probability pf of the roadbed surface layer under the worst spatial correlation distance $θ_{worst}$ obtained in step 5; outputting alarm information to monitoring personnel when the damage probability pf exceeds an alarm threshold p, thereby maintaining, by the monitoring personnel, the ballastless track roadbed in response to the alarm information; otherwise, quitting.

2. The ballastless track roadbed damage forewarning method according to claim 1, wherein the roadbed material parameters in step 1 comprise: base plate parameters, and material parameters of the roadbed surface layer and the roadbed bottom layer; and
    wherein the base plate parameters comprise: a density and modulus of elasticity; and the material parameters of the roadbed surface layer and the roadbed bottom layer comprise: a density, a gradation, modulus of elasticity, a cohesion and a friction angle.

3. The ballastless track roadbed damage forewarning method according to claim 1, wherein generating the lognormal random field of the particle contact friction coefficients in step 3, comprises:
    extracting spatial positions of the particle contact nodes and the particle contact friction coefficients in the discrete element model of the roadbed surface layer, and importing the spatial positions and the particle contact friction coefficients into a MATLAB script; and setting the spatial correlation distance θ of the particle contact friction coefficients of the roadbed surface layer in the MATLAB script, calculating a correlation coefficient ρ between friction coefficients at any two coordinate points by using a Markov spatial correlation function, and generating the lognormal random field of the particle contact friction coefficients.

4. The ballastless track roadbed damage forewarning method according to claim 3, wherein a formula of the Markov spatial correlation function in the MATLAB script is as follows:

$$\rho(\tau_x, \tau_y) = \exp\left(-\frac{2\sqrt{\tau_x^2 + \tau_y^2}}{\theta}\right)$$

wherein ρ represents the correlation coefficient between two coordinate points of the roadbed surface layer, $\tau_x$ and $\tau_y$ respectively correspond to absolute distances between the two coordinate points in horizontal and vertical directions, and θ represents a spatial correlation length.

5. The ballastless track roadbed damage forewarning method according to claim 1, wherein determining the worst spatial correlation distance $\theta_{worst}$ in step 5, comprises:
increasing the spatial correlation distance θ in the step by step manner, generating N random fields of the particle contact friction coefficients of the roadbed surface layer and performing N sampling on the precipitation under a i-th spatial correlation distance $\theta_i$, applying a high-speed train load and bringing the high-speed train load into model calculation to obtain N groups of dynamic response results of the base plate, and taking an average value of the N groups of dynamic response results as a representative value of the dynamic response of the base plate under $\theta_i$; and
comparing representative values of the dynamic response of the base plate under different $\theta_i$, taking the spatial correlation distance corresponding to the representative value of the maximum dynamic response as the worst spatial correlation distance $\theta_{worst}$.

6. The ballastless track roadbed damage forewarning method according to claim 1, wherein calculating the damage probability pf of the roadbed surface layer in step 6 comprises:
generating M random fields of the particle contact friction coefficients of the roadbed surface layer and performing M sampling on the precipitation under the worst spatial correlation distance $\theta_{worst}$ to obtain M groups of samples, and applying a high-speed train load to calculate a dynamic response of the base plate in each of the M groups of samples; and
when any dynamic response of the base plate exceeds a specified safety threshold, determining that the roadbed surface layer is damaged and endangers a superstructure, counting a number of damaged samples i, and calculating the damage probability using a formula: pf=i/M.

7. A forewarning system by using the ballastless track roadbed damage forewarning method according to claim 1, comprising: an information collection module, a processing module, and a forewarning module; wherein,
the information collection module is configured to collect material parameters of the ballastless track roadbed and real-time precipitation information;
the processing module is configured to load the FLAC-PFC model and calibrate the mesoscopic parameters based on information collected by the information collection module; load the MATLAB script, generate a random field, and assign the random field to the particle contact nodes; calculate the worst spatial correlation distance $\theta_{worst}$ and calculate the damage probability pf, and
the forewarning module is configured to determine whether the damage probability pf exceeds the alarm threshold; if the damage probability pf exceeds the alarm threshold, output the alarm information to the monitoring personnel, and the monitoring personnel maintain, in response to the alarm information, the ballastless track roadbed; if the damage probability pf does not exceed the alarm threshold, exit.

* * * * *